(12) United States Patent
Sarma et al.

(10) Patent No.: US 6,569,694 B1
(45) Date of Patent: May 27, 2003

(54) METHOD OF CHECKING BGA SUBSTRATE DESIGN

(75) Inventors: Pranabendra Sarma, San Jose, CA (US); Alexander Tain, Milpitas, CA (US); Valerie Vivares, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/892,799

(22) Filed: Jun. 28, 2001

Related U.S. Application Data

(60) Provisional application No. 60/214,445, filed on Jun. 28, 2000.

(51) Int. Cl.[7] .............................................. H01L 21/66
(52) U.S. Cl. ............................................................ 438/14
(58) Field of Search ........................... 716/1, 3, 5, 18; 438/14, 17

(56) References Cited

U.S. PATENT DOCUMENTS

| | | | | |
|---|---|---|---|---|
| 5,353,234 A | * | 10/1994 | Takigami | ................ 364/489 |
| 5,551,014 A | * | 8/1996 | Yoshida et al. | ............. 395/500 |
| 6,245,599 B1 | * | 6/2001 | Goto et al. | ................ 438/129 |
| 6,429,029 B1 | * | 8/2002 | Eldridge et al. | ............. 438/14 |

\* cited by examiner

*Primary Examiner*—David Nelms
*Assistant Examiner*—Quoc Hoang
(74) *Attorney, Agent, or Firm*—McDermott, Will & Emery

(57) ABSTRACT

A novel method is provided for checking BGA substrate design made using an APD design tool. User's netlist containing information on a die to be mounted on the BGA substrate is entered into an interface software system providing an interface to the APD design tool. The interface software system extracts the design netlist generated from the APD design of the BGA substrate, and compares this netlist to the user's netlist. If no differences are reported, the BGA substrate design is considered to be correct.

9 Claims, 2 Drawing Sheets

METHOD OF CHECKING BGA SUBSTRATE DESIGN

RELATED APPLICATIONS

This application claims priority from U.S. Provisional Patent Application Ser. No. 60/214,445, filed Jun. 28, 2000.

FIELD OF INVENTION

The present invention relates to integrated circuit packaging technology, and more specifically, to a computerized procedure for checking a Ball Grid Array (BGA) substrate design.

BACKGROUND ART

The explosive growth of high-density packaging has created a tremendous impact on the electronic assembly and manufacturing industry. Ball grid array (BGA), chip-scale package (CSP), and solder-bumped flip chip technologies are taking the lead in this advanced manufacturing process. Many major equipment makers and leading electronic companies are now gearing up for these emerging and advanced packaging technologies.

In particular, BGA packages give designers the capability to put more functionality into a small area. BGA packages provide a smaller footprint on the circuit board, albeit requiring the higher level of technology on the circuit board for a similar density in lines/spaces and small vias. As schematically illustrated in FIG. 1, a BGA package uses solder balls arranged in a grid pattern for connecting the package to a printed circuit board. In accordance with conventional practice, the BGA package is attached to the circuit board by reflowing the solder balls to make connections to conductors or trace metal patterns at the surface of the printed circuit board.

An integrated circuit (IC) chip or die is mounted on a substrate that contains plated via holes and the solder balls on its underside. The die has bond pads that are connected by bond wires to bond fingers on the upper surface of the substrate. A conventional integrated circuit encapsulant, such as a plastic molding compound, an epoxy resin or a potting compound is used to protect the chip and the wire interconnects. The packaged integrated circuit is bonded to the printed circuit board by reflowing the solder balls, typically at a temperature up to about 250° C.

As BGA packages occupy small areas on the circuit board, they found measurable success in small consumer oriented electronics, such as laptop computers, pagers and cellular phones.

BGA substrates are designed using various computer-aided design (CAD) tools such as Cadence® Advanced Package Design (APD) software. Then, BGA substrate manufacturers send BGA substrate designs to BGA package manufacturers for checking. Conventionally, a BGA substrate design is checked manually to make sure that the substrate design complies with the BGA package specification. Such checking procedures are time-consuming and result in multiple errors.

Therefore, it would be desirable to develop a computerized procedure for checking BGA substrate design.

SUMMARY OF THE INVENTION

The present invention offers a novel method of checking a substrate design made using a computer-aided design (CAD) tool. The method involves entering into an interface software system interfaced to the CAD tool, a user's netlist representing a die to be mounted on the substrate being checked. The interface system automatically extracts a design netlist representing the substrate being checked, and compares the design netlist to the user's netlist. If no differences are found, the substrate design is considered to be proper.

In accordance with a preferred embodiment of the present invention, the substrate being checked may be a ball grid array substrate. The CAD tool may be an advanced package design (APD) tool.

The user's netlist may comprise identification numbers and coordinates of die pads, and netnames representing functions of the die pads. The design netlist may comprise identification numbers and coordinates of die pads, netnames representing functions of the die pads, identification numbers and coordinates of bond fingers, and identification numbers and coordinates of solder balls.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE INVENTION

BGA substrates are designed using various computer-aided design tools such as Cadence® Advanced Package Design (APD) software. Then, BGA substrate manufacturers send BGA substrate designs to BGA package manufacturers for checking. Conventionally, a BGA substrate design is checked manually to make sure that the substrate design complies with the BGA package specification. Such checking procedures are time-consuming and result in multiple errors.

The present invention provides a computerized procedure for checking BGA substrate design. For example, the checking procedure of the present invention may be performed using such software as NETCHECK™ developed by Artwork Conversion Software, Inc., Santa Cruz, Calif. The NETCHECK system is capable of interfacing to the Cadence APD software that may be used for performing BGA substrate design. However, one skilled in the art would realize that the present invention may be implemented using any software that provides an interface to the computer-aided design tool used for BGA substrate design.

The NETCHECK software interfaces with the APD software to extract the netlist generated based on the APD design, and enables the designer to compare his netlist with the APD-based netlist. The NETCHECK system contains BFLABEL, Netout and Netcompare modules, which are SKILL-based programs that can run inside of the Cadence APD environment.

The BFLABEL module numbers and labels bond fingers of a BGA package. The Netout module extracts the netlist generated from the APD design including die pad numbers, die pad coordinates, bond finger numbers, bond finger coordinates, ball numbers, ball coordinates, and netnames indicating functions of die pads. The Netcompare module allows a netlist entered by the designer to be automatically compared with the APD-based netlist.

Figure 1:
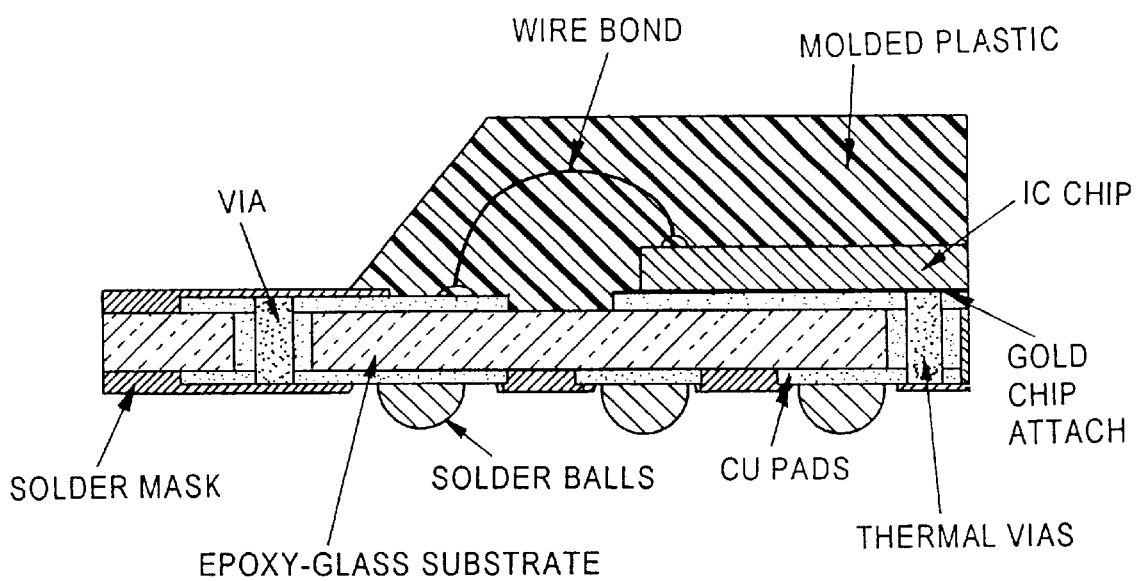
FIG. 1 illustrates a BGA package.
Figure 2:
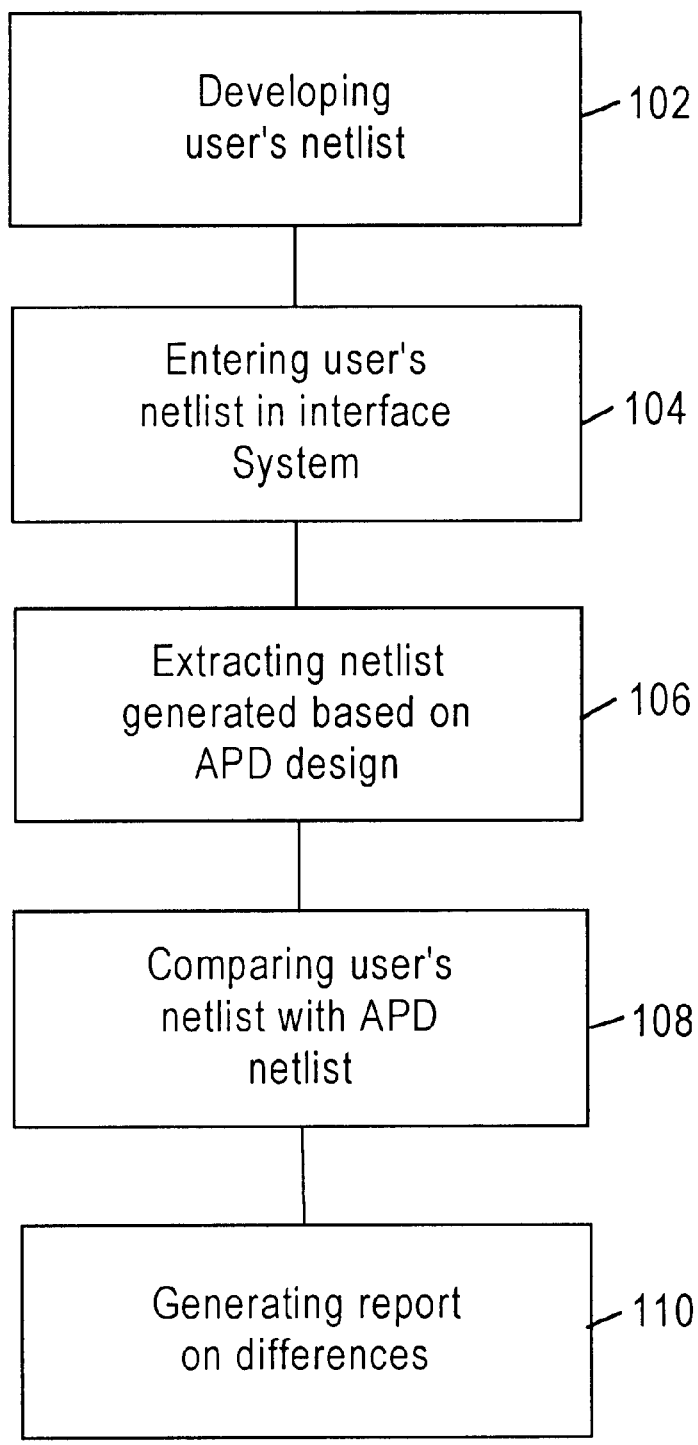
FIG. 2 is a flow chart illustrating a method of the present invention.

FIG. 2 is a flowchart of a method of the present invention to check design of a BGA substrate before manufacturing a BGA package based on the BGA substrate. In step 102, a user's netlist is developed. The user's netlist includes information representing a die to be mounted on the BGA substrate. Such information includes die pad numbers, die pad coordinates and netnames indicating die pad functions. User's netlists may be standardized to include die pad numbers, die pad coordinates and netnames.

In step 104, the user's netlist is entered into the NETCHECK system interfaced to the APD software defining the BGA substrate design being checked. The NETCHECK system organizes data from the user's netlist in an appropriate format. For example, the user's data may be organized in a table, which for each die pad identified by its number, comprises X-coordinate of the pad center, Y-coordinate of the pad center and the corresponding netname.

In step 106, the Netout module of the NETCHECK system automatically extracts an APD netlist generated based on the BGA substrate design performed using the APD software. The APD netlist may be die pad sorted. It includes such BGA package information as die pad numbers and coordinates of die pads, bond finger numbers and coordinates of bond fingers, ball numbers and coordinates of balls, and netnames.

In step 108, the Netcompare module of the NETCHECK system compares the APD netlist generated from the APD design of the BGA substrate to the user's netlist representing die information. In step 110, the NETCHECK system generates a report indicating differences between the user's netlist and the APD netlist. If no differences are reported, the user concludes that the BGA substrate design is proper.

Accordingly, the present invention offers a novel method for checking BGA substrate design made using the APD design tool. User's netlist containing information on a die to be mounted on the BGA substrate being checked is entered into the interface software system providing an interface to the APD design tool. The interface software system extracts the design netlist generated from the APD design of the BGA substrate, and compares this netlist to the user's netlist. If no differences are reported, the BGA substrate design is considered to be correct.

In this disclosure, there are shown and described only the preferred embodiment of the invention, but it is to be understood that the invention is capable of changes and modifications within the scope of the inventive concept as expressed herein. For example, the checking method of the present invention may be used for checking the design of various elements to be combined in integrated circuit packages of various types. Also, the elements of the integrated circuit packages may be designed using various computer-aided design tools.

What is claimed is:

1. A method of checking a substrate design made using a computer-aided design (CAD) tool, the method comprising the steps of:

entering into an interface system interfaced to the CAD tool, a user's netlist representing a die to be mounted on a substrate being checked;

automatically extracting by the interface system, a design netlist representing the substrate being checked; and automatically comparing by the interface system, the user's netlist to the design netlist to make a decision that the substrate design is proper if no differences are found.

2. The method of claim 1, wherein the substrate is a ball grid array substrate.

3. The method of claim 1, wherein the CAD tool is an advanced package design (APD) tool.

4. The method of claim 1, wherein the user's netlist comprises identification numbers and coordinates of die pads.

5. The method of claim 4, wherein the user's netlist further comprises netnames representing functions of the die pads.

6. The method of claim 1, wherein the design netlist comprises identification numbers and coordinates of die pads.

7. The method of claim 6, wherein the design netlist further comprises netnames representing functions of the die pads.

8. The method of claim 7, wherein the design netlist further comprises identification numbers and coordinates of bond fingers.

9. The method of claim 8, wherein the design netlist further comprises identification numbers and coordinates of solder balls.

* * * * *